United States Patent
Manna et al.

(10) Patent No.: US 12,221,694 B2
(45) Date of Patent: Feb. 11, 2025

(54) CONDITIONING OF A PROCESSING CHAMBER

(71) Applicant: Applied Materials, Inc., Santa Clara, CA (US)

(72) Inventors: Pramit Manna, Sunnyvale, CA (US); Swaminathan T. Srinivasan, Pleasanton, CA (US); Timothy J. Franklin, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1216 days.

(21) Appl. No.: 16/601,400

(22) Filed: Oct. 14, 2019

(65) Prior Publication Data

US 2020/0115795 A1    Apr. 16, 2020

Related U.S. Application Data

(60) Provisional application No. 62/745,576, filed on Oct. 15, 2018.

(51) Int. Cl.
| | |
|---|---|
| *C23C 16/44* | (2006.01) |
| *B08B 9/032* | (2006.01) |
| *C23C 16/455* | (2006.01) |
| *C23C 16/505* | (2006.01) |
| *H01J 37/32* | (2006.01) |

(52) U.S. Cl.
CPC ........ *C23C 16/4405* (2013.01); *B08B 9/0321* (2013.01); *C23C 16/4404* (2013.01); *C23C 16/45565* (2013.01); *C23C 16/505* (2013.01); *H01J 37/32082* (2013.01); *H01J 37/32449* (2013.01); *H01J 37/32862* (2013.01)

(58) Field of Classification Search
CPC ............ C23C 16/4405; C23C 16/4404; C23C 16/45565; C23C 16/505; B08B 9/0321; H01J 37/32082; H01J 37/32449; H01J 37/32862
See application file for complete search history.

(56) References Cited

U.S. PATENT DOCUMENTS

| | | | | |
|---|---|---|---|---|
| 5,843,239 | A * | 12/1998 | Shrotriya | H01J 37/32862 134/1.1 |
| 6,586,285 | B1 * | 7/2003 | Basceri | C23C 16/4404 438/151 |
| 6,620,256 | B1 * | 9/2003 | Arno | C23C 16/4405 134/21 |
| 6,716,658 | B2 * | 4/2004 | Park | C23C 16/4408 438/758 |
| 6,846,742 | B2 | 1/2005 | Rossman | |

(Continued)

OTHER PUBLICATIONS

Machine Translation of WO 2013147377A1 (Year: 2013).*

*Primary Examiner* — Sharidan Carrillo
(74) *Attorney, Agent, or Firm* — B. Todd Patterson

(57) ABSTRACT

A method for cleaning one or more interior surfaces of a processing chamber includes removing a processed substrate from the processing chamber, and introducing a first cleaning chemistry into the processing chamber to generate a first internal pressure of greater than 1.1 atm within the processing chamber and remove deposited contaminants from the one or more interior surfaces of the processing chamber. The method further comprises removing the cleaning chemistry from the processing chamber.

14 Claims, 4 Drawing Sheets

(56) References Cited

U.S. PATENT DOCUMENTS

| | | | |
|---|---|---|---|
| 7,306,680 B2* | 12/2007 | Heerens | G03F 7/70925 34/409 |
| 7,967,913 B2* | 6/2011 | Hua | C23C 16/4405 134/1.1 |
| 9,478,408 B2 | 10/2016 | Kang et al. | |
| 10,192,717 B2 | 1/2019 | Khaja et al. | |
| 2002/0014257 A1* | 2/2002 | Chandra | B01J 3/008 134/30 |
| 2003/0029475 A1* | 2/2003 | Hua | C23C 16/4405 134/1.1 |
| 2005/0005845 A1* | 1/2005 | Zajac | H01L 21/3065 118/715 |
| 2005/0028927 A1* | 2/2005 | Basceri | B08B 9/08 156/345.1 |
| 2006/0117743 A1* | 6/2006 | Swars | F01N 3/0296 60/297 |
| 2009/0023241 A1* | 1/2009 | Furuta | C23C 16/24 438/57 |
| 2009/0188532 A1* | 7/2009 | Endoh | B08B 3/02 134/198 |
| 2010/0297786 A1* | 11/2010 | Terashima | H01L 21/67207 118/500 |
| 2014/0087568 A1* | 3/2014 | Noda | H01L 21/02277 134/1.1 |
| 2015/0232986 A1* | 8/2015 | Kameda | C23C 16/45546 438/758 |
| 2018/0114679 A1* | 4/2018 | Shah | C23C 16/4408 |
| 2019/0157052 A1* | 5/2019 | Doan | B08B 7/0071 |
| 2020/0115795 A1* | 4/2020 | Manna | H01J 37/32449 |
| 2021/0050190 A1* | 2/2021 | Miura | H01J 37/3244 |

\* cited by examiner

CONDITIONING OF A PROCESSING CHAMBER

CROSS REFERENCE

This application claims priority to U.S. Provisional Patent Application, 62/745,576, filed on Oct. 15, 2018, the disclosure of which is incorporated herein by reference in its entirety.

BACKGROUND

Embodiments of the present disclosure generally relate to apparatus and methods for cleaning processing chambers, and, more particularly, to cleaning processing chambers at high pressures.

DESCRIPTION OF THE RELATED ART

In many conventional systems, unwanted deposition on the interior surfaces of a processing chamber, such as the walls or chamber lining components of the processing chamber, occur during a deposition process. Such unwanted deposition may create particles and affect the optical and/or heat transfer characteristics (e.g., absorption, transmission, insulative properties, etc.) of the chamber components and thermal stability of the chamber, resulting in the drift of process conditions and affecting the process reproducibility and uniformity. Commonly, the processing chambers are cleaned after every few processing runs using pressures at or below 1 atm. However, such cleaning processes may not sufficiently remove all unwanted depositions from the interior of the processing chamber or the cleaning processes may be slow, taking relative long periods of time, during which the processing chamber is taken offline. Thus, there is a need for a cleaning process that more completely removes unwanted deposition in a shorter time period.

SUMMARY

A method for cleaning one or more interior surfaces of a processing chamber includes removing a processed substrate from the processing chamber, and introducing a first cleaning chemistry into the processing chamber to generate a first internal pressure of greater than 1.1 atm within the processing chamber and remove deposited contaminants from the one or more interior surfaces of the processing chamber. The method further comprises removing the cleaning chemistry from the processing chamber.

In one embodiment, a processing chamber for processing a substrate comprises one or more walls defining an internal region for processing a substrate, a vacuum pump fluidly coupled to the internal region, and a controller. The controller is configured to generate a first internal pressure of greater than 1.1 atm within the internal region after removing the processed substrate from the processing chamber during a first cleaning period by instructing a gas supply source to introduce a first cleaning chemistry into the internal region. Further, the controller is configured to instruct the vacuum pump to remove the cleaning chemistry.

In one embodiment, a method for processing a substrate comprises transferring a substrate for processing into the processing chamber, processing the substrate by depositing one or more materials onto the substrate, removing the processed substrate from the processing chamber, introducing a first cleaning chemistry into the processing chamber to generate a first internal pressure of greater than 1.1 atm within the processing chamber and remove deposited contaminants from one or more interior surfaces of the processing chamber, and removing the cleaning chemistry from the processing chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments discussed and described herein provide methods and systems for removing unwanted deposition from one or more internal surfaces within a processing chamber. In various embodiments, a cleaning cycle including a cleaning process utilizing an internal pressure of at least 1.1 atm within the processing chamber is used to clean the internal surfaces of the processing chamber, removing unwanted depositions from the internal surfaces. In various embodiments, a cleaning cycle including a first cleaning process utilizing an internal pressure of at least 1.1 atm, and a second cleaning process utilizing an internal pressure below 1 atm within the processing chamber may be employed to remove the unwanted depositions. The first and second cleaning processes may be different sub-steps of the cleaning cycle.

Figure 1:
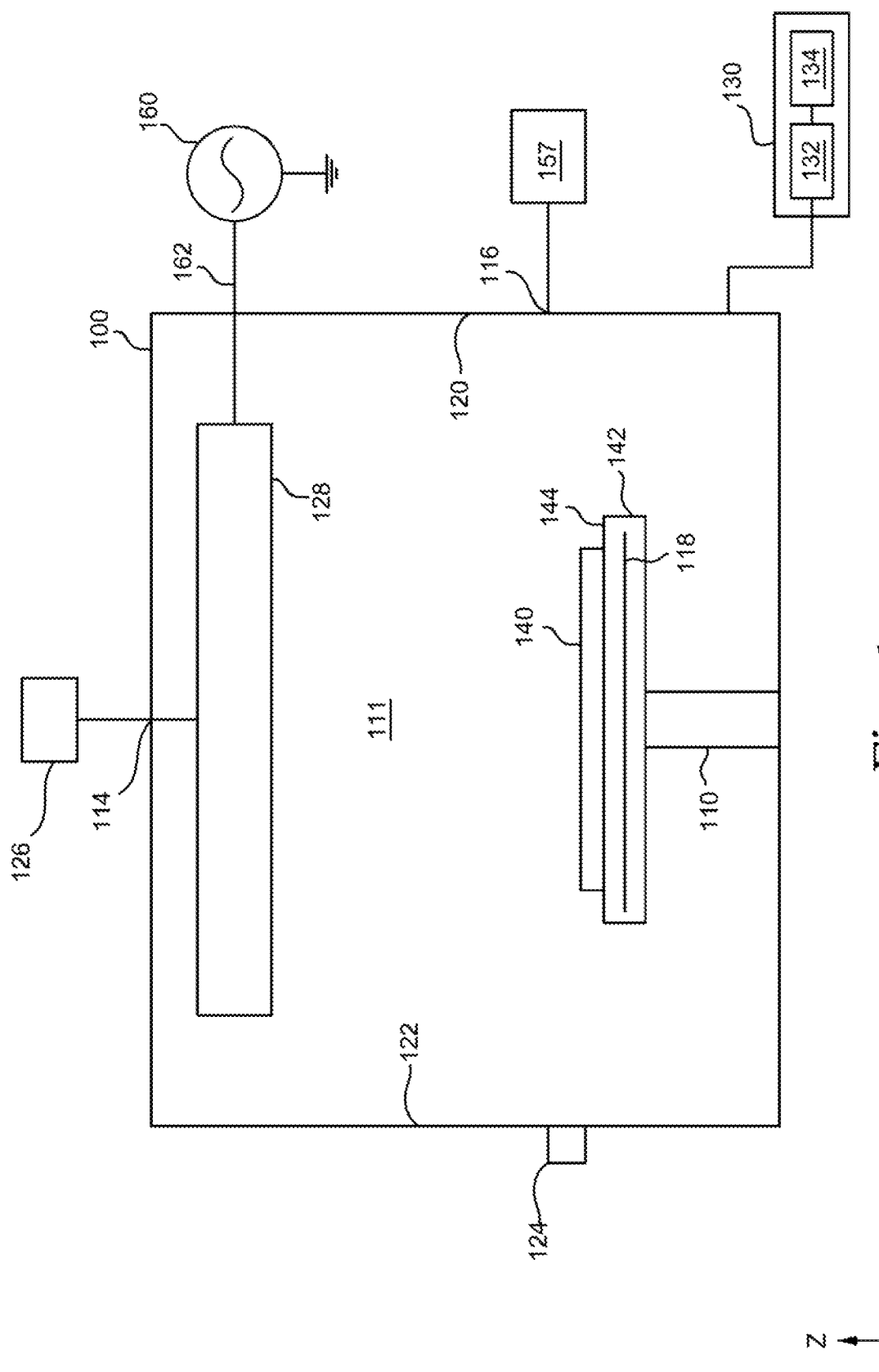
FIG. 1 illustrates a schematic side view of a processing chamber, according to one or more embodiments.

FIG. 1 illustrates a schematic sectional view of a processing chamber 100 according to one or more embodiments. The processing chamber 100 is used to process one or more substrates 140 therein, including the processes of depositing a material on a substrate 140, heating of the substrate 140, etching of the substrate 140, or combinations thereof.

The processing chamber 100 has an internal region 111 that includes a substrate support 142 disposed therein to support a substrate 140. The substrate support 142 includes a heating element 118 and that retains the substrate 140 on a top surface 144 of the substrate support 142, such as an electrostatic chuck, a vacuum chuck, a substrate retaining clamp, or the like. The substrate support 142 is coupled to and movably disposed in the internal region 111 by a stem 110 connected to a lift system that moves the substrate support 142 between an elevated processing position and a lowered position that facilitates transfer of the substrate 140 to and from the processing chamber 100 through an opening 124.

The processing chamber 100 includes a gas supply source 126, such as a gas box. For example, the gas supply source 126 may include a mass flow control (MFC) device, disposed between a gas source and the internal region 111 to control a flow rate of process gasses from the gas source to a showerhead 128 used for distributing the process gasses across the internal region 111. The showerhead 128 is connected to a RF power source 160 by a RF feed 162 for generating a plasma in the internal region 111 from the process gasses. The RF power source 160 may provide RF energy to the showerhead 128 to facilitate generation of a plasma between the showerhead 128 and the substrate support 142. The stem 110 is configured to move the substrate support 142 to an elevated processing position to process the substrate 140. Further, the vacuum pump 157 is coupled to the internal region 111 for controlling the pressure within the internal region 111.

A process gas, such as a deposition gas or cleaning chemistry, supplied from a gas supply source 126 is introduced into the internal region 111 through the gas inlet 114 of the processing chamber 100.

The process gas exits the internal region through the gas outlet 116. Removal of the process gas, including cleaning chemistry, through the gas outlet 116 is facilitated by a vacuum pump 157 coupled to the gas outlet 116. The cleaning chemistry may include one or more of steam, chlorine, and/or a hydrochloride, as well as activated (e.g., plasma) species thereof, which may be provided via gas supply source 126 for cleaning of the processing chamber 100.

The above-described processing chamber 100 can be controlled by a processor based system controller, such as controller 130. For example, the controller 130 is configured to control flow of various precursor gases, process gases, and purge gases from the gas supply source 126, during different operations of a substrate processing sequence. By way of further example, the controller 130 is configured to control feeding of gases, lamp operation, or other process parameters, among other controller operations. The controller 130 is configured to control flow of a cleaning chemistry into the processing chamber 100 and the pressure within the interior of the chamber during cleaning.

The controller 130 is generally used to facilitate the control and automation of the components within the processing chamber 100. The controller 130 can be, for example, a computer, a programmable logic controller, or an embedded controller. The controller 130 typically includes a central processing unit (CPU) 132 memory 134, and support circuits for inputs and outputs (I/O). The CPU 132 may be one of any form of computer processors that are used in industrial settings for controlling various system functions, substrate movement, chamber processes, and control support hardware (e.g., sensors, motors, heaters, etc.), and monitor the processes performed in the processing chamber 100. The memory 134 is connected to the CPU 132, and may be one or more of a readily available non-volatile memory, such as random access memory (RAM), flash memory, read only memory (ROM), floppy disk, hard disk, or any other form of digital storage, local or remote. Software instructions and data can be coded and stored within the memory for instructing the CPU 132. The support circuits. Support circuits may include cache, power supplies, clock circuits, input/output circuitry, subsystems, and the like and may be coupled the CPU 132 to support the processor. A program (e.g., software routine or computer instructions) stored within the memory 134 and readable by the controller 130 determines which tasks are performable by the components in the processing chamber 100. Preferably, the program is software readable by the processor within the controller 130 that includes code to perform tasks relating to monitoring, execution and control of the delivery and control of the process variables utilized in one or more the processes performed within the processing chamber 100, and the movement, support, and/or positioning of the substrate 140 and other components within the processing chamber 100 along with the various process tasks and various sequences being controlled the by controller 130.

A deposition process is utilized to process the substrate 140 at a processing pressure to deposit or grow a film onto the substrate 140. However, during the deposition process, the deposition material may also be deposited onto one or more interior walls 120, 122 of the processing chamber and other surfaces within the processing chamber 100 (e.g., on a surface of substrate support 142). Such unwanted deposition may create particles and affect the optical and/or heat transfer characteristics (e.g., absorption, transmission, insulative properties, etc.) of the chamber components and thermal stability of the processing chamber 100, resulting in the drift of process conditions and affecting process reproducibility and uniformity. Thus, after one or more processing cycles, one or more cleaning cycles may be performed to remove any unwanted deposition from within the processing chamber 100.

Various embodiments of the present disclosure provide for a high pressure cleaning period which may utilized to remove unwanted deposition from an internal surface of the processing chamber 100. During a high pressure cleaning period, the internal pressure of the processing chamber 100 may be at least 1.1 atm. Further, during the high pressure cleaning period, the internal pressure of the processing chamber 100 may be in a range of greater than about 1 atm, such as about 1.1. atm to about 70 atm. Additionally, or alternatively, during the high pressure cleaning period, the internal pressure of the processing chamber 100 may be in a range of about 2 atm to about 3 atm, about 1.1 atm to about 10 atm, about 10 atm to about 30 atm, or about 40 atm to about 70 atm. However, the internal pressure of the processing chamber 100 may exceed 70 atm during the high pressure cleaning period.

A cleaning chemistry is introduced into internal region 111 of the processing chamber 100 via gas supply source 126 to generate the interior pressure during the high pressure cleaning period. For example, controller 130 may be configured to provide instructions to the gas supply source 126 to provide the cleaning chemistry until the desired internal pressure has been achieved. One or more exhaust valves and/or the pump 157 may be controlled by the controller 130 to facilitate achievement of a predetermined pressure within the process chamber 100. The cleaning chemistry is provided via showerhead 128.

Lamps and/or other heating elements may be utilized to increase the temperature of the processing chamber and/or to assist in generating the desired internal pressure. Further, the controller 130 may turn off or adjust the speed of the vacuum pump 157 while the cleaning chemistry is applied to the internal region 111 of the processing chamber 100, thereby further facilitating pressure control within the processing chamber 100.

The cleaning chemistry may be steam, chlorine, plasma or a hydrochloride. Further, depending on the pressure levels, different cleaning chemistries may be utilized. For example, steam may be utilized at pressure levels of about 10 atm. Further, a hydrochloride may be utilized at pressure levels of about 1.1 atm to about 3 atm. Additionally, chlorine may be utilized at pressure levels of about 1.1 atm to about 70 atm.

The processing chamber 100 includes one more supporting features to allow the processing chamber to support a high pressure cleaning cycle. For example, the processing chamber 100 may include a compressible metal O-ring and/or one or more gaskets between the lid and the body of processing chamber to maintain a seal within the processing chamber during the high pressure clean cycle. Further, the chamber lid may be maintained in a sealed position through the use of a clamp during the cleaning cycle.

The processing chamber 100 is configured to perform substrate processing, such as depositions, under vacuum conditions (e.g., less than 1 atm). Additionally, the processing chamber 100 is configured to perform cleaning operations at pressures of 1.1 atmosphere or greater. Thus, the processing chamber 100 is configured for both sub-atmospheric and supra-atmospheric conditions. In contrast, conventional process chambers are designed for subatmospheric conditions (both cleaning and deposition), and therefore, high pressure cleaning (e.g., 1.1 atm or grater) as described herein has not previously been contemplated.

Figure 2:
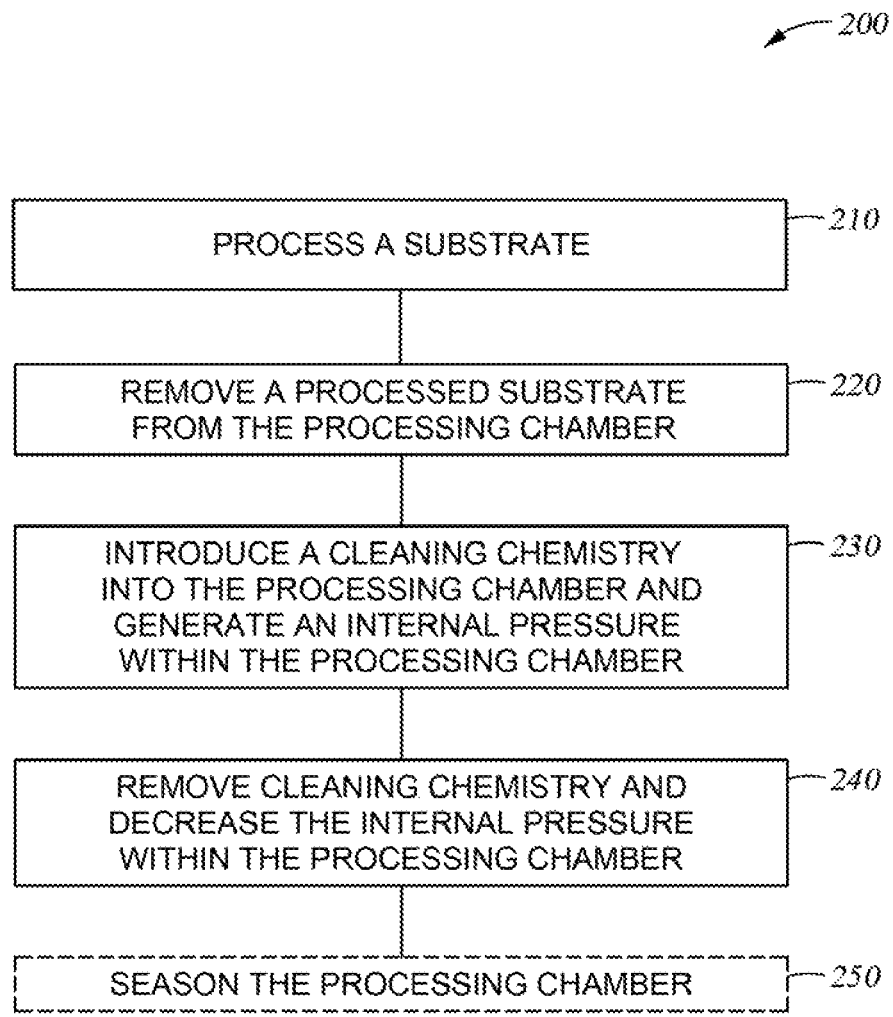
FIG. 2 illustrates a method for cleaning a processing chamber, according to one or more embodiments.

FIG. 2 is a flowchart of a method 200 for cleaning a processing chamber (e.g., processing chamber 100). At block 210 a substrate is processed. For example, a substrate 140 may undergo a processing process where one or more films are deposited or grown on the substrate. The controller 130 is configured to initiate processing and control the internal pressure of the processing chamber 100 and the flow of processing gas into the processing chamber 100. The cleaning process may occur after the completion of the processing of a substrate, after the completion of the processing of multiple substrates, and/or after a predetermined period of time. For example, the predetermined period of time may correspond to one or more hours.

Substrate processing (such as deposition, etching, or thermal processing) may be completed at low processing pressures (e.g., 100 mTorr to 750 Torr) or at a high processing pressure (e.g., 1 atm to 70 atm). Further, during substrate processing a process gas is fed into the internal of the processing chamber 100 via gas supply source 126 to deposit a film on the substrate 140, remove a film from the substrate 140, or treat a film on the substrate 140. After the substrate processing has been completed, the controller 130 instructs the vacuum pump 157 to remove the processing gas from the processing chamber 100 via gas outlet 116.

During substrate processing material is deposited onto one or more surfaces within the processing chamber 100 in addition to that of the substrate 140. Such material may be referred to as unwanted depositions and may introduce unwanted particles (e.g., contaminants) into the internal of the processing chamber 100. Further, the unwanted particles may generate one or more irregularities on the surface of the processed substrate 140, reducing production yield of the processing chamber.

At block 220, the processed substrate is removed from the processing chamber. For example, the controller 130 may instruct a robot to remove the processed substrate 140 through an opening in the processing chamber 100.

At block 230 of method 200, a cleaning chemistry is introduced into the processing chamber and a first internal pressure is generated in the processing chamber. For example controller 130 may instruct gas supply source 126 to flow a cleaning chemistry into the processing chamber 100 to generate the first internal pressure. The chemistry may include steam, chlorine, or another cleaning chemistry. The first internal pressure is greater than about 1.1 atm and may be referred to as a high pressure. The first internal pressure may be in a range of about 1.1 atm to about 70 atm, such as about 1.5 atm to about 70 atm, about 2 atm to about 70 atm, about 3 atm to about 70 atm, about 5 atm to about 70 atm, or about 10 atm to about 70 atm. Further, the first internal pressure may be greater than 70 atm. Additionally, the first internal pressure may be greater than the internal pressure utilized during processing of the substrate 140.

Additionally, or alternatively, the internal pressure of the processing chamber 100 may be increased by increasing the temperature of the processing chamber 100 with lamps and/or other heating elements, such as resistive heating elements, of the processing chamber 100.

Additionally, or alternatively, before the cleaning chemistry is introduced into the processing chamber 100, the vacuum pump 157 is controlled to allow the internal pressure within the processing chamber 100 to increase.

The pressure utilized during the high pressure cleaning period may correspond to one or more parameters of the processing chamber 100. For example, the pressure utilized during the high pressure cleaning period may set such that the pressure does not exceed the safe operating parameters of the processing chamber 100. For example, the processing chamber 100 may be a high pressure processing chamber able to withstand interior pressures in excess of about 70 atm, and the high pressure cleaning period may utilize internal pressures within the operating pressures of the processing chamber 100. Further, the internal pressure utilized during a high pressure cleaning period may exceed the internal pressures utilized during processing the substrate 140.

High pressure cleaning periods may be utilized to increase the efficiency of a cleaning process for a substrate processing chamber. For example, high pressure cleaning periods may reduce the length of time that cleaning process operates to remove contaminants from the internal region 111 of the processing chamber 100 as compared to a low pressure cleaning period. Additionally, or alternatively, cleaning processes employing high pressure cleaning periods may remove more contaminants than those that only employ low pressure cleaning periods.

Embodiments of the disclosure include methods and apparatus of removing contaminants from the internal region 111 of a processing chamber 100. For example, unwanted deposition from one or more internal surfaces within a processing chamber may be removed by utilizing a cleaning process that utilizes an internal pressure within the processing chamber of at least 1.1 atm. Cleaning processes that utilize an internal pressure of at least 1.1 atm may operate for a shorter period of time to remove contaminants from the internal region of the processing chamber as compared to cleaning processes that only utilize internal pressures less than 1 atm. Further, cleaning processes that utilize an internal pressure of at least 1.1 atm may remove more contaminants than those that employ only internal pressures less than 1 atm.

During the cleaning cycle, particles (e.g., contaminants) that were deposited on the interior walls 122 and 120 and other surfaces within the processing chamber 100 react with the cleaning chemistry for form a volatile compound which is sublimated and removed from the chamber at the end of the cleaning period and/or cycle.

At block 240, the cleaning chemistry is removed and the internal pressure of the processing chamber is reduced. Further, as the cleaning chemistry is removed and the internal pressure is decreased, a volatile compound formed by reacting particles within a processing chamber with a cleaning chemistry during the cleaning cycle may be removed from the processing chamber.

At block 250, a seasoning process for seasoning of the interior of the processing chamber may be optionally performed. For example, after the cleaning chemistry has been removed from the processing chamber, one or more interior surfaces of the processing chamber 100 are seasoned. Seasoning the interior surfaces of the processing chamber 100 includes forming a seasoning layer on at least the substrate supporting features (e.g., substrate support 142, stem 110) to protect the backside layers of the substrate from being damaged by any irregularities, such as contaminants, found on the substrate support 142 surface. Further, seasoning one or more interior surfaces of the processing chamber 100 includes forming a seasoning layer on at least on interior wall (e.g., interior walls 120 and 122) to protect the substrate from being damaged by any irregularities found on the interior walls 120 and 122 during processing.

Seasoning the interior surfaces of the processing chamber 100 may make those surfaces easier to clean during the cleaning cycle. For example, lower pressure, shorter, and/or less cleaning cycles may be utilized when cleaning processing chambers 100 that have been seasoned. Further, seasoning the interior surface of the processing chamber 100 comprises depositing a seasoning layer one or more interior surfaces. The seasoning layer may be conformally formed on the exposed interior surfaces of the processing chamber 100. The seasoning layer can have a hardness in the range between about 2 GPa to about 50 GPa. Suitable material may include, but is not limited to, silicon, silicon nitride, silicon oxide, carbon doped silicon oxide (SiOC), silicon carbide (SiC), nitrogen containing silicon carbide (SiCN), aluminum oxide, aluminum nitride, undoped silicon glass (USG), such as silicon oxide, boron-silicate glass (BSG), phosphorus-silicate glass (PSG), or boron-phosphorus-silicate glass (BPSG), or any combination thereof. Other materials, such as those having lower hardness and are resistant to degradation from exposure to the chemistry used in the processing of a substrate, may also be used. The seasoning layer may be a single layer of the material listed above or a layer stack including any combination of the materials listed above. Further, the seasoning layer can have a thickness of about 0.3 µm to about 10 µm.

Figure 3:
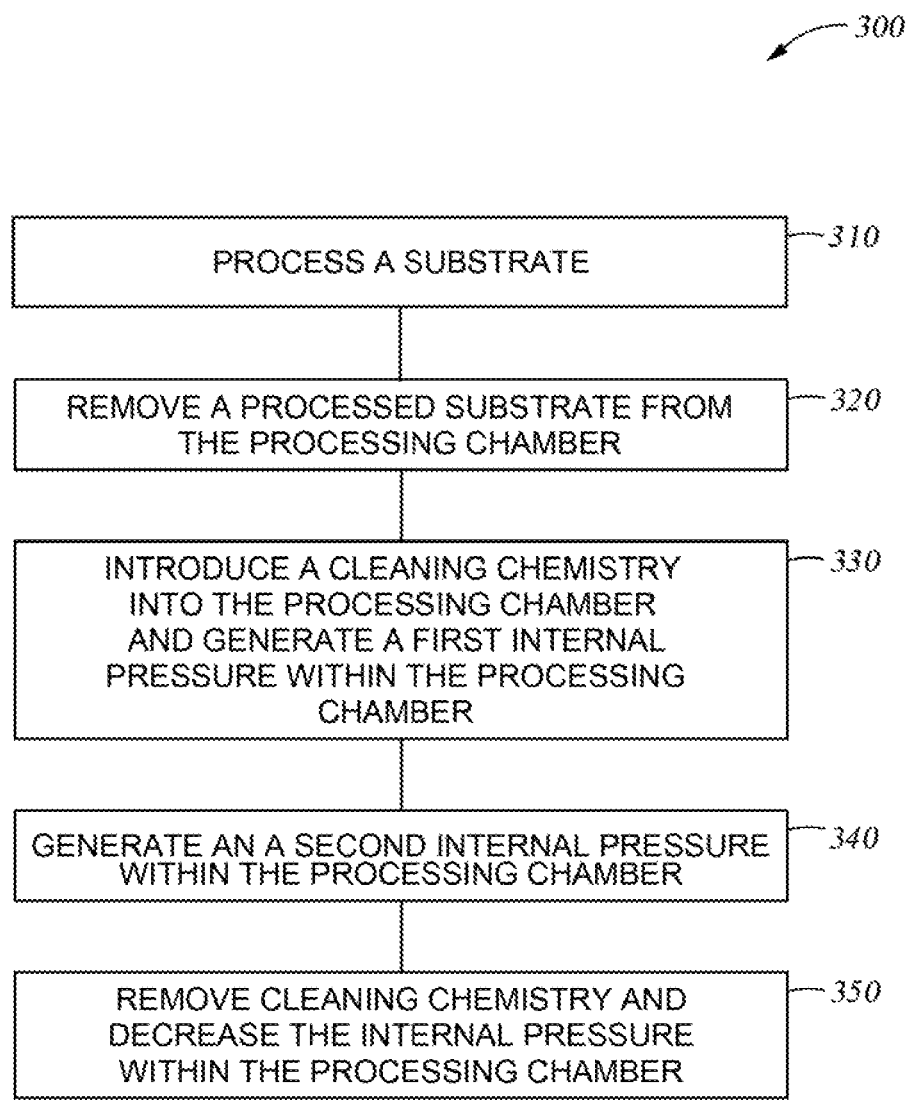
FIG. 3 illustrates a method for cleaning a processing chamber, according to one or more embodiments.

FIG. 3 is a flowchart of an alternative method 300 for cleaning the internals of a processing chamber according to one or more embodiments. At block 310, a substrate is processed and at block 320 a processed substrate is removed from the processing chamber. Blocks 310 and 320 are similar to that of blocks 210 and 220 of method 200, respectively.

At block 330, a cleaning chemistry is introduced into the processing chamber and a first internal pressure of an internal region within the processing chamber is generated. For example, controller 130 instructs the gas supply source 126 to flow a cleaning chemistry into the processing chamber 100 increasing the internal pressure of the processing chamber 100. The chemistry may be steam, chlorine, or another cleaning chemistry. Further, the controller 130 instructs the gas supply source 126 to flow the cleaning chemistry into the processing chamber 100 until the desired internal pressure has be achieved. Alternatively, or additionally, the temperature of the processing chamber 100 may be increased to increase the internal pressure. For example, lamps and/or other heating elements are utilized to increase the temperature of the processing chamber 100, increasing the internal pressure of the processing chamber 100.

The first internal pressure is greater than about 1.1 atm and may be referred to as a high pressure. The first internal pressure is in a range of about 1.1 atm to about 70 atm, such as about 1.5 atm to about 70 atm, about 2 atm to about 70 atm, about 3 atm to about 70 atm, about 5 atm to about 70 atm, or about 10 atm to about 70 atm. Further, the first internal pressure may be greater than 70 atm. Further, the first internal pressure may be greater than the internal pressure utilized during processing of the substrate 140.

During the cleaning cycle, particles that were deposited on the interior walls 122 and 120 and other surfaces within the processing chamber 100 react with the cleaning chemistry for form a volatile compound which is sublimated and removed from the processing chamber 100 at the end of the cleaning period and/or cycle.

At block 340, a second internal pressure is generated within the processing chamber. A second cleaning chemistry may be introduced into the internal region 111 of the processing chamber 100 via gas supply source 126 to generate a interior pressure utilized during the low pressure cleaning period. The gas supply source 126 may be configured to flow the second cleaning chemistry to generate the internal pressure of the low pressure cleaning period. For example, controller 130 may be configured to provide instructions to the gas supply source 126 to provide the second cleaning chemistry via gas inlet until the desired internal pressure has been achieved for the low pressure cleaning period. Additionally, lamps and/or other heating elements may be utilized to increase the temperature of the processing chamber to assist in generating the desired internal pressure. The second cleaning chemistry may be different than the first cleaning chemistry. Alternatively, the first and second cleaning chemistries may be the same. In one embodiment, which may be combined with other embodiments herein, the low pressure during the cleaning period is 1 atm or less, such as 500 torr or less, such as 300 torr or less, or such as 400 torr to 760 torr. In another embodiment, which may be combined other embodiments herein, remote plasma energy and/or UV energy may be utilized to activate the second cleaning chemistry to facilitate chamber cleaning.

The second internal pressure may be less than the first internal pressure. For example, the second pressure may be less than about 1 atm. Further, the second internal pressure may be less than the internal pressure utilized during processing of the substrate 140. The first internal pressure may be referred to as high pressure and the second internal pressure may be a low pressure.

Before the processing chamber 100 may be cycled from the first internal pressure (e.g., high pressure) to the second internal pressure (e.g., low pressure), the vacuum pump 157 evacuates the second cleaning chemistry and the particles that have been removed from an internal surface of the processing chamber 100. The vacuum pump 157 may exhaust gas from the internal region 111 until the internal pressure of the processing chamber 100 is lower than the second internal pressure. Further, after the second internal pressure is generated and the second cleaning chemistry is flowed into the processing chamber 100, the vacuum pump 157 evacuates the second cleaning chemistry and the particles that have been removed from an internal surface of the processing chamber 100.

The cleaning periods utilizing internal pressures and/or cleaning chemistries different from that of the high pressure cleaning period and the low pressure cleaning period may be utilized. Such cleaning periods may be referred to as an intermediate cleaning period. For example, at least one cleaning period having an internal pressure less than that of the high pressure cleaning period and greater than that of the low pressure cleaning period may be utilized in addition to at least one of the high pressure clean period and the low pressure clean period. Further, at least one cleaning period utilizing a cleaning chemistry different than that of the high pressure cleaning period and the low pressure cleaning period may be utilized in addition to at least one of the high pressure clean period and the low pressure clean period. Alternatively, or additionally, at least one cleaning period utilizing an internal pressure less than that of the high pressure cleaning period and greater than that of the low pressure cleaning period, and a cleaning chemistry different than that of the high pressure cleaning period and the low pressure cleaning period may be utilized in addition to at least one of the high pressure clean period and the low pressure clean period.

A cleaning cycle may include at least one high pressure cleaning period and low pressure cleaning period. Alternatively, a first cleaning cycle may include a high pressure cleaning period and a low pressure cleaning period, and a second cleaning cycle includes one of a high pressure cleaning period and a low pressure cleaning period. Further, a cleaning cycle includes a high pressure cleaning period, a low pressure cleaning period, and an intermediate cleaning cycle. Additionally, a cleaning cycle may include multiple high pressure cleaning cycles, each utilizing different pressures of greater than 1.1 atm.

For example, a third internal pressure may be generated within the processing chamber 100 after the second internal pressure has been generated. Further, the third internal pressure is generated after the second cleaning chemistry and the corresponding particles have been removed. The third internal pressure may be different from the first and second internal pressures or the third internal pressure may be substantially similar to one of the first internal pressure. For example, the third internal pressure may be greater than the first internal pressure, between the first and second internal pressures, or less than the second internal pressure. Further, generating the third internal pressure may comprise introducing a third cleaning chemistry into the processing chamber. The third chemistry may be different from the first and second cleaning chemistries or similar to one of the first and second cleaning chemistries.

At block 350, the cleaning chemistry within the processing chamber 100 is removed and the internal pressure of the processing chamber is set such that a substrate may be inserted within the processing chamber 100 for processing. For example, the internal pressure of the processing chamber 100 may be returned to about 1 atm. Further, as the cleaning chemistry is removed, a volatile compound formed by reacting particles within a processing chamber with a cleaning chemistry during the cleaning cycle may be removed from the processing chamber.

After the cleaning chemistry has been removed and before a substrate is inserted, seasoning of the interior of the processing chamber may be optionally performed. For example, after the cleaning chemistry has been removed from the processing chamber, one or more interior surfaces of the processing chamber 100 are seasoned as described with regard to block 250 of FIG. 2.

Figure 4:
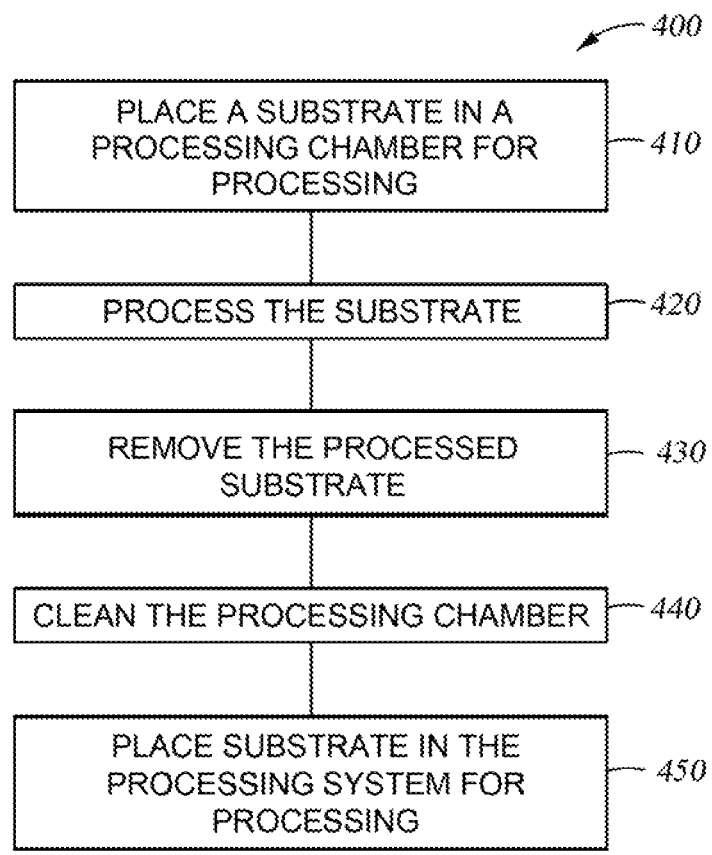
FIG. 4 illustrates a method for processing a substrate and cleaning a processing chamber, according to one or more embodiments.

FIG. 4 illustrates a method 400 for processing a substrate in a processing chamber and cleaning the processing chamber 100. At block 410, a substrate is placed in a processing chamber for processing. A robot may be utilized to load the substrate 140 into the processing chamber 100. At block 420, the substrate is processed. Further, the controller 130 instructs gas supply source 126 to introduce a processing gas into the processing chamber 100.

At block 430 the processed substrate is removed from the processing chamber 100. For example, a processed substrate may be removed via an opening in processing chamber 100 via a robot. Before the processed substrate is removed, the vacuum pump 157 is configured to exhaust the processing gas from the chamber. The vacuum pump 157 may be configured to return the internal pressure of the processing chamber to about 1 atm before the processed substrate is removed from the chamber.

At block 440, the processing chamber is cleaned to remove unwanted depositions that are formed while the substrate is processed. The unwanted depositions may be formed on one or more interior walls (e.g., interior wall 120 and 122) and/or other surfaces within the processing chamber 100. Further, cleaning the interior of the processing chamber 100 may include flowing a first cleaning chemistry (e.g., gas) into the processing chamber 100 until a desired internal pressure is reached during a first cleaning period. The internal pressure may be at least about 1.1 atm. The first cleaning chemistry is then evacuated from the processing chamber along with any particles that have been removed from one or more of the interior surfaces of the processing chamber 100. A second cleaning chemistry may be fed into the processing chamber 100 to generate a second internal pressure within the processing chamber 100 during a second cleaning period. The first and second cleaning chemistries may be the same or different. The second internal pressure is less than the first internal pressure. For example, the second internal pressure may be less than about 1 atm. Cleaning of the processing chamber 100 is described in more detail with regard to block 230 of FIG. 2 and blocks 330 and 340 of FIG. 3.

The controller 130 is configured to complete one or more cleaning cycles, where each cleaning cycle includes at least a first cleaning period and a second cleaning period. Alternatively, the controller 130 completes a first cleaning cycle that includes a first cleaning period and a second cleaning period, and a cleaning cycle comprising the first cleaning period.

Cleaning of the processing chamber may further include seasoning one or more interior surfaces of the processing chamber 100. For example, seasoning one or more interior surfaces of the processing chamber 100 includes forming a seasoning layer on at least the substrate supporting features (e.g., substrate support 142, stem 110) of the processing system to protect the backside layers of the substrate from being damaged by any irregularities found on the substrate support 142 surface. Further, seasoning one or more interior surfaces of the processing chamber 100 may include forming a seasoning layer on at least one interior wall (e.g., interior walls 120 and 122) to protect the substrate from being damaged by any irregularities found on the interior walls 120 and 122 during processing. Seasoning of the processing chamber 100 is described in better detail with regard to block 350. At block 450, a new substrate is placed in the processing chamber for processing.

Embodiments of the disclosure include methods and apparatus of removing contaminants from the internal region 111 of a processing chamber 100. For example, unwanted deposition from one or more internal surfaces within a processing chamber may be removed by utilizing a cleaning process that utilizes an internal pressure within the processing chamber of at least 1.1 atm. Cleaning processes that utilize an internal pressure of at least 1.1 atm may operate for a shorter period of time to remove contaminants from the internal region of the processing chamber as compared to cleaning processes that only utilize internal pressures less than 1 atm. Further, cleaning processes that utilize an internal pressure of at least 1.1 atm may remove more contaminants than those that employ only internal pressures less than 1 atm.

While the foregoing is directed to examples of the present disclosure, other and further examples of the disclosure may be devised without departing from the basic scope thereof, and the scope thereof is determined by the claims that follow.

What is claimed is:

1. A method for cleaning one or more interior surfaces of a processing chamber, the method comprising:
   introducing a first cleaning chemistry comprising at least one of steam, chlorine, hydrochloride, or plasma into the processing chamber to generate a first internal pressure of about 1.5 atm to about 10 atm during a first cleaning period within the processing chamber and remove deposited contaminants from one or more interior surfaces of the processing chamber;
   removing the first cleaning chemistry from the processing chamber; and
   generating a second internal pressure within the processing chamber during a second cleaning period, wherein the second cleaning period is subsequent to the first cleaning period, and wherein the second internal pressure is 1 atm or less, and wherein generating the second internal pressure within the processing chamber comprises introducing a second cleaning chemistry different than the first cleaning chemistry into the processing chamber.

2. The method of claim 1, further comprising:
   performing a seasoning process that comprises depositing one or more seasoning layers on the one or more interior surfaces of the processing chamber.

3. The method of claim 1, further comprising processing a substrate, wherein the substrate is processed at a processing pressure less than the first internal pressure.

4. The method of claim 1, further comprising processing a substrate, wherein the substrate is processed at a processing pressure greater than or equal to the internal first pressure.

5. The method of claim 1, wherein the first internal pressure is at least 2 atm.

6. The method of claim 1, wherein the first cleaning chemistry is chlorine.

7. A method for processing a substrate in a processing chamber, the method comprising:
   transferring the substrate for processing into the processing chamber;
   processing the substrate by depositing one or more materials onto the substrate;
   removing the processed substrate from the processing chamber;
   introducing a first cleaning chemistry comprising at least one of steam, chlorine, plasma, or hydrochloride, into the processing chamber to generate a first internal pressure of about 1.5 atm to about 10 atm during a first cleaning period within the processing chamber and remove deposited contaminants from one or more interior surfaces of the processing chamber;
   removing the first cleaning chemistry from the processing chamber; and
   introducing a second cleaning chemistry into the processing chamber to generate a second internal pressure within the processing chamber during a second cleaning period, wherein the second cleaning period is subsequent to the first cleaning period, and wherein the second internal pressure is 1 atm or less.

8. The method of claim 7, wherein the second cleaning chemistry is different than the first cleaning chemistry.

9. The method of claim 7, wherein the substrate is processed at a processing pressure less than the first internal pressure.

10. The method of claim 7, wherein the first cleaning chemistry comprises steam.

11. The method of claim 7, wherein the first cleaning chemistry comprises chlorine.

12. The method of claim 7, wherein the first cleaning chemistry comprises plasma.

13. The method of claim 7, wherein the first cleaning chemistry comprises hydrochloride.

14. A method for cleaning one or more interior surfaces of a processing chamber, the method comprising:
   introducing a first cleaning chemistry into the processing chamber to generate a first internal pressure of about 1.5 atm to about 10 atm within the processing chamber and remove deposited contaminants from one or more interior surfaces of the processing chamber; and
   removing the first cleaning chemistry from the processing chamber;
   wherein the first cleaning chemistry is steam.

* * * * *